United States Patent
Seibel et al.

(10) Patent No.: US 9,784,783 B2
(45) Date of Patent: Oct. 10, 2017

(54) METHOD AND DEVICE TO IDENTIFY, RECORD AND STORE TRAVELING WAVE HEADS IN ELECTRIC POWER SYSTEMS

(75) Inventors: Conrado Werner Seibel, Florianópolis (BR); Carlos Alberto Dutra, Florianópolis (BR)

(73) Assignee: Reason Tecnologia S.A., Florianópolis, Santa Catarina (BR)

( * ) Notice: Subject to any disclaimer, the term of this patent is extended or adjusted under 35 U.S.C. 154(b) by 907 days.

(21) Appl. No.: 13/254,438

(22) PCT Filed: Jan. 12, 2010
(Under 37 CFR 1.47)

(86) PCT No.: PCT/BR2010/000010
§ 371 (c)(1),
(2), (4) Date: Mar. 20, 2012

(87) PCT Pub. No.: WO2010/099585
PCT Pub. Date: Sep. 10, 2010

(65) Prior Publication Data
US 2013/0116944 A1    May 9, 2013

(30) Foreign Application Priority Data
Mar. 5, 2009   (BR) .................................. 0901107

(51) Int. Cl.
*G01R 31/08* (2006.01)
(52) U.S. Cl.
CPC ........... *G01R 31/08* (2013.01); *G01R 31/086* (2013.01)

(58) Field of Classification Search
CPC ............................ G05B 19/4065; G01R 31/08
See application file for complete search history.

(56) References Cited

U.S. PATENT DOCUMENTS

| 4,766,549 | A  | * | 8/1988  | Schweitzer et al. ............ 702/59 |
| 5,160,926 | A  | * | 11/1992 | Schweitzer, III ........ H02H 3/04 324/115 |
| 6,768,211 | B2 | * | 7/2004  | Kulinsky ...................... 257/783 |
| 6,825,670 | B2 | * | 11/2004 | Bussinger ............. G01M 3/181 324/522 |
| 6,980,007 | B1 | * | 12/2005 | Lo et al. ....................... 324/543 |

(Continued)

FOREIGN PATENT DOCUMENTS

EP    2017632 A1 *  1/2009 ........... G01R 31/088

OTHER PUBLICATIONS

Analog Devices, AN-611, 2003, 50 Hz /60 Hz Rejection "Sigma-Delta" ADCs, by Adrian Sherry, pp. 1-4.*

(Continued)

*Primary Examiner* — Janet Suglo
*Assistant Examiner* — Lisa Peters
(74) *Attorney, Agent, or Firm* — Foley & Lardner LLP

(57) ABSTRACT

METHOD AND DEVICE TO IDENTIFY, RECORD AND STORE TRAVELING WAVE HEADS IN ELECTRIC POWER SYSTEMS consisting in sending a trigger (5) signal generated from the monitoring of the basic values of voltage and current of the electrical signal (1) of the transmission system in its fundamental frequency of operation (50/60 Hz), where the generated trigger (5) signal is controlled by continuous monitoring of the parameters derived from the basic values of current and voltage and tested against thresholds previously set by a user.

18 Claims, 2 Drawing Sheets

(56) References Cited

U.S. PATENT DOCUMENTS

2004/0189317 A1\* 9/2004 Borchert ............ G01R 31/3275
  324/512
2008/0077336 A1\* 3/2008 Fernandes ............ G01R 15/142
  702/57

OTHER PUBLICATIONS

Strang, Considerations for Use of Disturbance Recorders, Dec. 27, 2006, IEEE Power Engineering Society, pp. 1-35.\*

\* cited by examiner

| | Description | Upper Limit | Lower Limit | Rate of Change | Rising Edge | Falling Edge | High Level | Low Level |
|---|---|---|---|---|---|---|---|---|
| Voltage | | | | | | | | |
| ABC | Phase RMS | ● | ● | ● | | | | |
| N | Neutral RMS | ● | ● | ● | | | | |
| ABC1 | Phasor RMS | ● | ● | ● | | | | |
| N1 | Neutral Phasor RMS | ● | ● | ● | | | | |
| F | Frequency Positive | ● | ● | ● | | | | |
| S+ | Sequence Negative | ● | ● | ● | | | | |
| S- | Sequence | ● | ● | ● | | | | |
| U | Unbalance | ● | ● | ● | | | | |
| THD | Harmonic Distortion | ● | ● | ● | | | | |
| Current | | | | | | | | |
| ABC | RMS | ● | ● | ● | | | | |
| N | Neutral RMS Phasor | ● | ● | ● | | | | |
| ABC1 | RMS Neutral Phasor | ● | ● | ● | | | | |
| N1 | RMS Positive | ● | ● | ● | | | | |
| S+ | sequence Negative | ● | ● | ● | | | | |
| S- | sequence Unbalance | ● | ● | ● | | | | |
| U | Harmonic Distortion | ● | ● | ● | | | | |
| THD | | ● | ● | ● | | | | |
| Power | | | | | | | | |
| S | Apparent Power Phasor | ● | ● | ● | | | | |
| S1 | Apparent Power Phasor | ● | ● | ● | | | | |
| P1 | Active Power Phasor | ● | ● | ● | | | | |
| Q1 | Reactive Power | ● | ● | ● | | | | |
| DC Transducer | | ● | ● | | | | | |
| Digital Channels | | | | | ● | ● | ● | ● |

Fig.3

METHOD AND DEVICE TO IDENTIFY, RECORD AND STORE TRAVELING WAVE HEADS IN ELECTRIC POWER SYSTEMS

This report discloses a device used on electric power transmission networks to identify and determine the location of faults.

A fault is a random and unpredictable event in electric power systems generated by short-circuits, burned up fields, lightnings, falling down of towers, breakage of insulators, cables and others. These faults are considered transitory when the supply of electric power is not interrupted. Occasionally, when interruption is needed, it is performed by security instruments in order to protect the stability of the system and the equipment in the transmission/distribution of the electric power. The occurrence of faults in electric power systems is totally undesirable and their causes must be identified and properly eliminated as soon as possible.

In order to determine the location of these faults, a method based upon the traveling waves it is used. Traveling waves in power transmission lines continually occur by any discontinuity of the electrical signals in the power network. Therefore, the most common causes are related to Faults and switching operations in order to operate the system.

The fault location through traveling waves is based on theory that a fault in a line brings about a high frequency pulse (head) of an electromagnetic traveling wave. The detection of this pulse with an extremely accurate time stamp allows the calculation of the distance of the point where the fault has occurred. Each wave comprises a frequency spectrum, from a few kHz to several MHz, and has a fast ascending slope and slower descending slope. Its propagation speed is close to the speed of light in the vacuum and it is attenuated by the means of propagation. The waves travel through the electric power system network until it has its amplitude decreased due to the loss of power, impedance and deflections occurred in the network.

A device to determine the location of faults based upon traveling waves methods must show, as its main features, the determination of the location, the measuring and recording of the correct wave head caused by a specific fault.

Presently the devices found in the market show a great inconvenience which is low reliability on detecting the correct wave head related to a fault. This low reliability is due to the strategy used to set off the trigger of the wave head measuring system. The strategy of current devices is based on the level (magnitude) of the wave head itself upon arriving at the measuring system. Nevertheless, this trigger solution related only to the wave head itself has shown to be of low reliability. The adjustment accuracy of such kind of trigger may be very hard to be obtained because of the high number of wave heads continually generated and, therefore, sometimes the wave head detected is not the correct wave head related to the fault. This is especially true when transitory faults, set off by burned up fields, lightnings, dirt on the insulators, etc., do not start the protection system and consequently the line is not permanently shut off.

The object of the present invention consists in a system to determine the location of faults through traveling waves assuring greater reliability due to the greater certainty of detecting the correct traveling wave responsible for the fault in the transmission line.

The inventive step is based upon the principle that a fault not only generates a wave head but it also generates changes in the electrical parameters of the current and voltage analogical signals in the fundamental frequency (50/60 Hz) of the operation system. That is, the basic signals of current and voltage in 50/60 Hz suffer disturbances that alter the balance parameters associated with their magnitude and frequency. The inventive step consists in generating a trigger which is not based upon the level of the wave head, but upon the continuous monitoring of the fault itself through measurement of the basic values of the voltage and current electrical signals in its fundamental frequency of operation (50/60 Hz). The changing of these basic values is continually monitored and tested against thresholds previously defined by the user, generating a trigger whenever one of these thresholds is exceeded.

The device proposed comprises a signal conditioning module, a high speed data acquisition module and a trigger generating module. One advantage of the device that identifies the traveling wave head to determine the location of faults in electric power systems hereby presented is the elimination of the low reliability in identifying and detecting the traveling wave related to a fault. Another advantage of the device to identify the traveling wave head hereby presented is the possibility of using this device in methods determining the location based upon a "single-end" feature, which consists in recording the traveling wave at one end of the line; a "double-end" feature, which consists in recording the traveling wave at both ends of the same line; or a combination of both features. Another advantage of the device to identify the traveling wave head hereby presented is the separation of the wave head recording process from the wave head detection process. The recording is performed by the data acquisition module and the detection is performed by the trigger generating module.

The description of the drawings hereinafter allows the comprehension of the wave head detection and recording system, object of the present report.

FIG. 3 is a table that shows an example of the parameters and thresholds that can be monitored by the system.

Figure 1:
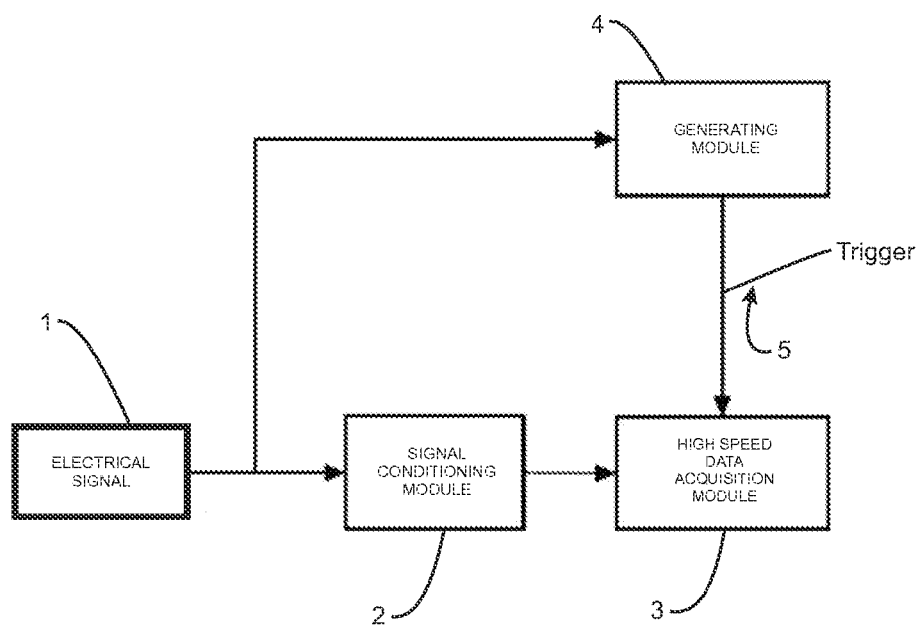
FIG. 1 is a block diagram that shows the interconnection of modules comprising the system, showing the electrical signal (1) of the transmission line, the signal conditioning module (2), the high speed data acquisition module (3) and the trigger (5) generating module (4).
Figure 2:
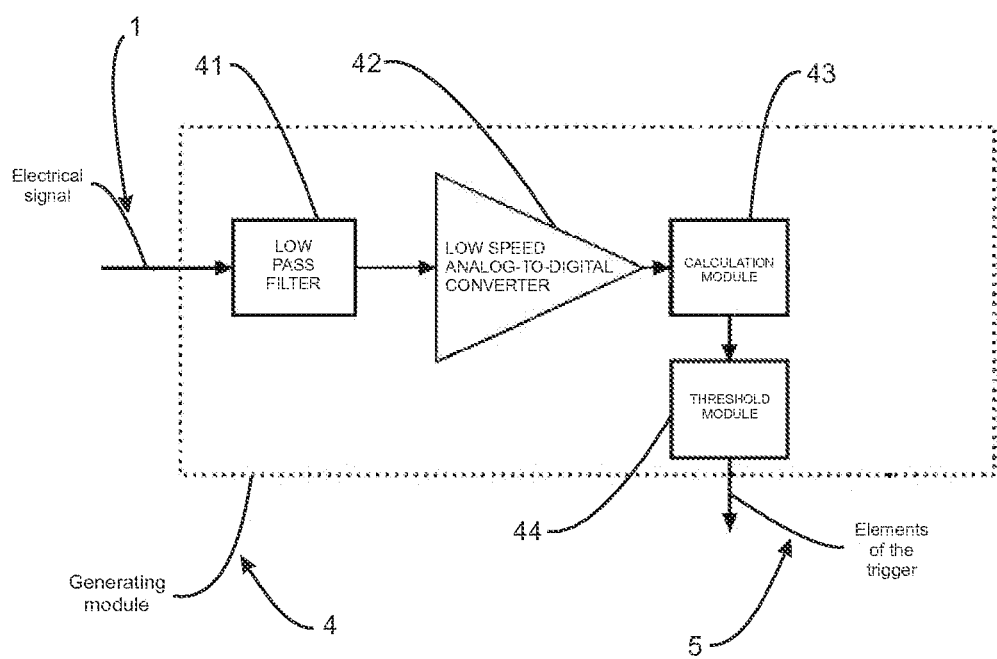
FIG. 2 is a block diagram that shows the elements of the trigger (5) generating module (4)

According to the figures shown, the electrical signal (1) of the transmission line goes through the signal conditioning module (2), and then through the high speed data acquisition module (3) and then to the trigger (5) generating module (4).

The function of the signal conditioning module (2) is to filter the basic signal (1) in order to keep only the frequency components related to a traveling wave spectrum.

High speed data acquisition module (3) is responsible for sampling the electrical signal (1) related to the traveling wave in order to effectively record such wave continually sampling the electrical signal.

The function of the trigger (5) generating module (4) is to generate a trigger (5) in order to control the acquisition module (3) informing such acquisition module (3) that it has to store the sampled signal (1) related to a traveling wave. The trigger (5) generating module (4) comprises a low-pass filter (41) set to the electric signal (1) in order to remove the high frequency components, mainly the ones related to the basic frequency (50/60 Hz); a low speed analog-to-digital converter A/D (42) to perform the sampling of the electric signal (1) to digitize the information; a derived values calculation module (43); and a threshold module (44) which performs the test of the previously set thresholds to generate the trigger (5) signal.

The threshold module (44) uses Boolean equations with the purpose of obtaining more flexibility to control the generation of such trigger (5) signal. The exceeded threshold can be combined by using the Boolean logic "(A∧B∧C∧ . . . ) ∧(D∨E∧F∧ . . . ) ∨ . . . " where: "A, B, C, . . . " represent the result of the monitoring of the thresholds. "∧" represents the Boolean operator "AND" and "∨" represents the Boolean operator "OR". The final result of the Boolean expression performed at the threshold module (44) is used to generate the trigger (5) signal which is sent to the traveling waves acquisition module (3).

Control of the trigger (5) signal is performed by continuous monitoring the parameters derived from the basic values of current and voltage tested in relation to the threshold previously set by the user.

FIG. 3 shows a table with examples of the parameters and thresholds that can be monitored according to the user's choice, generating a trigger (5) whenever one of these thresholds is exceeded.

The parameters derived from the basic value of voltage, which are monitored by the user, are: the RMS (Root Mean Square) value, the RMS neutral value, the RMS value of the fundamental component, the RMS value of the neutral fundamental component, the frequency, the positive sequence, the negative sequence, the imbalance and the total harmonic distortion.

The parameters derived from the basic value of current, which are monitored by the user, are: the RMS value, the RMS neutral value, the RMS value of the fundamental component, the RMS value of the neutral fundamental component, the positive sequence, the negative sequence, the imbalance and the total harmonic distortion.

The parameters derived from the basic value of power, which are monitored by the user, are: the combined apparent power, the fundamental apparent power, the fundamental active power and the fundamental reactive power.

In this example, the specific parameter aforementioned have been used to characterize the effective industrial usage of the present invention, although it is possible to group other parameters derived from the basic electrical values of "current" and "voltage".

The invention claimed is:

1. A system for determining the location of a fault in an electric power transmission network, comprising:
  a fault locating equipment configured to be coupled to an electrical line of the power transmission network, the equipment including:
    a signal conditioning circuit configured to:
      extract frequency components of an electrical signal passing through the electrical line and related to a traveling wave caused by the fault, the electrical signal having a fundamental frequency of 50 Hz or 60 Hz; and
      transmit the frequency components of the electrical signal to a data acquisition module;
    a trigger generating circuit including:
      a low-pass filter configured to isolate at least one of a voltage or a current of the electrical signal corresponding to the fundamental frequency by removing components of the electrical signal having a frequency greater than the fundamental frequency;
      an analog-to-digital converter configured to digitize the isolated at least one of the voltage or the current;
      a calculation circuit configured to derive a parameter in the fundamental frequency from the isolated at least one of the voltage or the current of the electrical signal; and
      a threshold circuit configured to test the parameter in the fundamental frequency, and in response to the parameter in the fundamental frequency exceeding a threshold at a time stamp, generate a trigger signal identifying the traveling wave caused by the fault;
      wherein the trigger generating circuit is configured to transmit the trigger signal to the data acquisition circuit to inform the data acquisition circuit to store samples of the electrical signal; and
    the data acquisition circuit coupled to the signal conditioning circuit and to the trigger generating circuit and configured to:
      generate at least one first sample from the electrical signal transmitted by the signal conditioning circuit; and
      in response to receiving the trigger signal, store a second sample out of the at least one first sample, the second sample corresponding to the time stamp, to determine the location of the fault in the electrical line of the power transmission network.

2. The system of claim 1, wherein the parameter in the fundamental frequency includes at least one of a phase root-mean-square (RMS) value, a neutral RMS value, a phasor RMS value, a neutral phasor RMS value, a frequency, a positive sequence, a negative sequence, an unbalance, and a harmonic distortion of the voltage of the electrical signal corresponding to the frequency of 50 Hz or 60 Hz.

3. The system of claim 1, wherein the parameter in the fundamental frequency includes at least one of a phase root-mean-square (RMS) value, a neutral RMS value, a phasor RMS value, a neutral phasor RMS value, a frequency, a positive sequence, a negative sequence, an unbalance, and a harmonic distortion of the current of the electrical signal corresponding to the frequency of 50 Hz or 60 Hz.

4. The system of claim 1, wherein the parameter in the fundamental frequency includes at least one of an apparent power, a phasor apparent power, a phasor active power, and a phasor reactive power of the electrical signal corresponding to the frequency of 50 Hz or 60 Hz.

5. The system of claim 1, wherein the parameter in the fundamental frequency is based on a digital channel received from one or more devices that monitor electrical signals corresponding to the frequency of 50 Hz or 60 Hz.

6. The system of claim 1, wherein the trigger generating module is configured to continuously monitor the parameter in the fundamental frequency in order to generate the trigger signal in response to the parameter in the fundamental frequency exceeding the threshold.

7. The system of claim 1, wherein the trigger generating module is further configured to derive a plurality of parameters in the fundamental frequency from the isolated at least one of the voltage or current of the electrical signal corresponding to the frequency of 50 Hz or 60 Hz, compare the plurality of parameters in the fundamental frequency to a corresponding plurality of thresholds, and generate the trigger signal in response to at least one of the plurality of parameters in the fundamental frequency exceeding the plurality of thresholds.

8. The system of claim 7, wherein the trigger generating module is further configured to calculate a combined threshold using Boolean logic, and generate the trigger signal in response to the combined threshold being exceeded.

9. The system of claim 1, wherein the signal conditioning circuit is configured to receive the electrical signal on a first path, and the low-pass filter of the trigger generating circuit is configured to receive the electrical signal on a second path separate from the first path.

10. A method of determining the location of a fault in an electric power transmission network using fault locating equipment configured to be coupled to an electrical line of the power transmission network, comprising:
   conditioning an electrical signal passing through the electrical line in a signal conditioning circuit of the fault locating equipment, the electrical signal having a fundamental frequency of 50 Hz or 60 Hz, wherein conditioning the electrical signal includes:
      extracting frequency components of the electrical signal related to a traveling wave caused by the fault; and
      transmitting the frequency components of the electrical signal to a data acquisition circuit;
   generating a trigger signal at a trigger generating circuit of the fault locating equipment, the trigger generating circuit including a low-pass filter, an analog-to-digital converter, a calculation circuit, and a threshold circuit, wherein generating the trigger signal includes:
      at the low-pass filter, isolating at least one of a voltage or a current of the electrical signal corresponding to the fundamental frequency by removing components of the electrical signal having a frequency greater than the fundamental frequency;
      at the analog-to-digital converter, digitizing the isolated at least one of the voltage or the current;
      at the calculation circuit, deriving a parameter in the fundamental frequency from the isolated at least one of the voltage or the current of the electrical signal;
      at the threshold circuit, testing the parameter in the fundamental frequency in order to generate a trigger signal identifying the traveling wave caused by the fault in response to the parameter in the fundamental frequency exceeding a threshold at a time stamp; and
      transmitting the trigger signal from the trigger generating circuit to the data acquisition circuit to inform the data acquisition circuit to store samples of the electrical signal;
   identifying the traveling wave caused by the fault at the data acquisition circuit, wherein identifying the traveling wave includes:
      generating a at least one first sample from the electrical signal transmitted by the signal conditioning circuit;
      in response to receiving the trigger signal, storing a second sample of the at least one first sample, the second sample corresponding to the time stamp; and
      determining the location of the fault in the electrical line of the power transmission network based on the first set of samples.

11. The method of claim 10, wherein the parameter in the fundamental frequency includes at least one of a phase root-mean-square (RMS) value, a neutral RMS value, a phasor RMS value, a neutral phasor RMS value, a frequency, a positive sequence, a negative sequence, an unbalance, and a harmonic distortion of the voltage of the electrical signal corresponding to the frequency of 50 Hz or 60 Hz.

12. The method of claim 10, wherein the parameter in the fundamental frequency includes at least one of a phase root-mean-square (RMS) value, a neutral RMS value, a phasor RMS value, a neutral phasor RMS value, a frequency, a positive sequence, a negative sequence, an unbalance, and a harmonic distortion of the current of the electrical signal corresponding to the frequency of 50 Hz or 60 Hz.

13. The method of claim 10, wherein the parameter in the fundamental frequency includes at least one of an apparent power, a phasor apparent power, a phasor active power, and a phasor reactive power of the electrical signal corresponding to the frequency of 50 Hz or 60 Hz.

14. The method of claim 10, wherein the parameter in the fundamental frequency is based on a digital channel received from one or more devices that monitor electrical signals corresponding to the frequency of 50 Hz or 60 Hz.

15. The method of claim 10, wherein controlling the trigger signal further includes deriving a plurality of parameters in the fundamental frequency from the isolated at least one of the voltage or current of the electrical signal corresponding to the frequency of 50 Hz or 60 Hz, comparing the plurality of parameters in the fundamental frequency to a corresponding plurality of thresholds, and generating the trigger signal in response to at least one of the plurality of parameters in the fundamental frequency exceeding the plurality of thresholds.

16. The method of claim 15, wherein controlling the trigger signal further includes calculating a combined threshold using Boolean logic, and generating the trigger signal in response to the combined threshold being exceeded.

17. The method of claim 10, wherein the step of generating the trigger signal is performed continuously.

18. The method of claim 10, wherein conditioning the electrical signal includes receiving the electrical signal on a first path, and generating the electrical signal includes receiving the electrical signal at the low-pass filter on a second path separate from the first path.

* * * * *